(12) United States Patent
Blumich et al.

(10) Patent No.: US 8,148,988 B2
(45) Date of Patent: Apr. 3, 2012

(54) MAGNET ARRANGEMENT AND METHOD FOR PROVIDING A MAGNETIC FIELD IN A SENSITIVE VOLUME

(75) Inventors: Bernhard Blumich, Rott (DE); Ernesto Pablo Danieli, Aachen (DE); Federico Casanova, Aachen (DE); Juan Francisco Perlo, Aachen (DE)

(73) Assignee: RWTH Aachen, Aachen (DE)

( * ) Notice: Subject to any disclaimer, the term of this patent is extended or adjusted under 35 U.S.C. 154(b) by 288 days.

(21) Appl. No.: 12/498,107

(22) Filed: Jul. 6, 2009

(65) Prior Publication Data

US 2010/0013473 A1    Jan. 21, 2010

(30) Foreign Application Priority Data

Jul. 7, 2008   (EP) .................................. 08159850

(51) Int. Cl.
 *G01V 3/00* (2006.01)
(52) U.S. Cl. ....................................................... 324/319
(58) Field of Classification Search ........... 324/300–322
See application file for complete search history.

(56) References Cited

U.S. PATENT DOCUMENTS

| | | | | |
|---|---|---|---|---|
| 4,498,048 A * | 2/1985 | Lee et al. ....................... | 324/309 |
| 4,538,130 A | 8/1985 | Gluckstern et al. | |
| 4,580,098 A * | 4/1986 | Gluckstern et al. ........... | 324/307 |
| 4,703,276 A | 10/1987 | Beer | |
| 4,727,327 A * | 2/1988 | Toyoshima et al. ........... | 324/309 |
| 4,829,277 A * | 5/1989 | Stahura et al. ................ | 335/306 |
| 4,931,760 A * | 6/1990 | Yamaguchi et al. ........... | 335/306 |
| 5,148,138 A * | 9/1992 | Miyata ........................... | 335/302 |
| 5,438,264 A * | 8/1995 | Takeshima et al. ............ | 324/319 |
| 5,659,250 A * | 8/1997 | Domigan et al. .............. | 324/320 |
| 6,163,154 A * | 12/2000 | Anderson et al. ............. | 324/320 |
| 6,404,197 B1 * | 6/2002 | Anderson et al. ............. | 324/311 |
| 6,489,872 B1 * | 12/2002 | Fukushima et al. ........... | 335/299 |
| 6,621,395 B1 * | 9/2003 | Bromberg ...................... | 335/216 |
| 6,828,892 B1 * | 12/2004 | Fukushima et al. ........... | 335/299 |
| 7,760,059 B2 * | 7/2010 | Higuchi ......................... | 335/306 |

FOREIGN PATENT DOCUMENTS

| EP | 0167639 A | 1/1986 |
|---|---|---|
| JP | 4022336 A | 1/1992 |

OTHER PUBLICATIONS

Perlo J. et al: "Ex situ NMR in highly homogeneous fields: <1>H Spectroscopy", Science, American Association for the Advancement of Science, US, Washington, DC. vol. 315, No. 5815, Feb. 23, 2007, pp. 1110-1112, XP002437076, ISSN: 0036-8075. Jachmann R. et al: "Multipole shimming of permanent magnets using harmonic corrector rings", Review of Scientific Instruments, AIP, Melville, NY, US, vol. 78, No. 3, Mar. 30, 2007, pp. 35115-35115, XP012103867, ISSN: 0034-6748.

* cited by examiner

*Primary Examiner* — Dixomara Vargas
(74) *Attorney, Agent, or Firm* — BrainwoodHuang

(57) ABSTRACT

A magnet arrangement includes (a) a first and a second head ring magnet each having a substantially circular geometry with respect to a center axis and (b) a central ring magnet having a substantially circular geometry with respect to a center axis. The central ring magnet is disposed between the first and second head ring magnet in direction of the center axis. At least one of the magnets includes a first number of first magnets having at least one trapezoidal cross section and a second number of second magnets having at least one rectangular cross section. The second magnets are disposed in between the first magnets in circumferential direction. With this geometrical arrangement, magnets having a trapezoidal cross section include a guidance for a magnet having a rectangular cross section allowing the movements in radial direction of these last magnets.

20 Claims, 3 Drawing Sheets

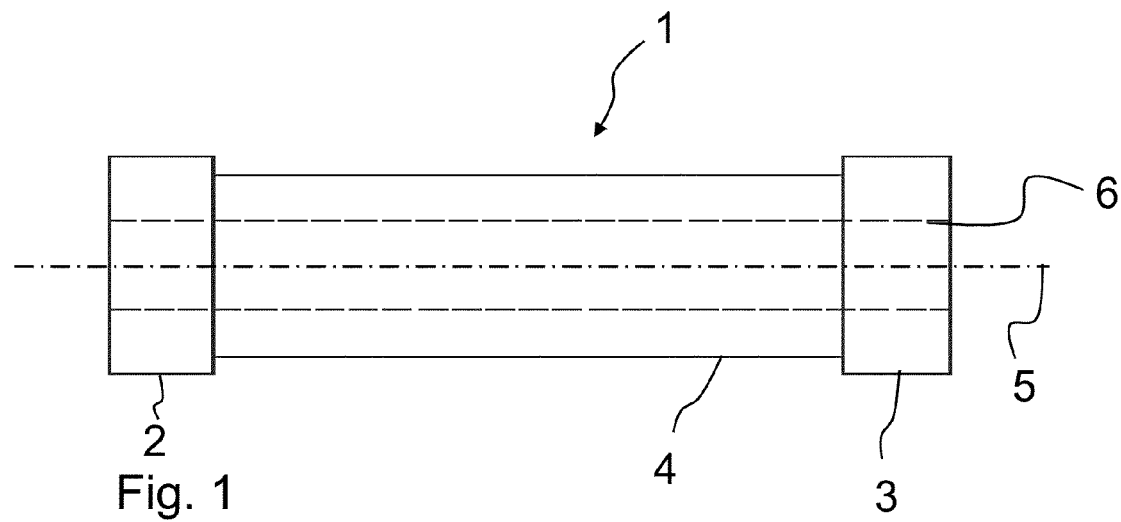
Fig. 1
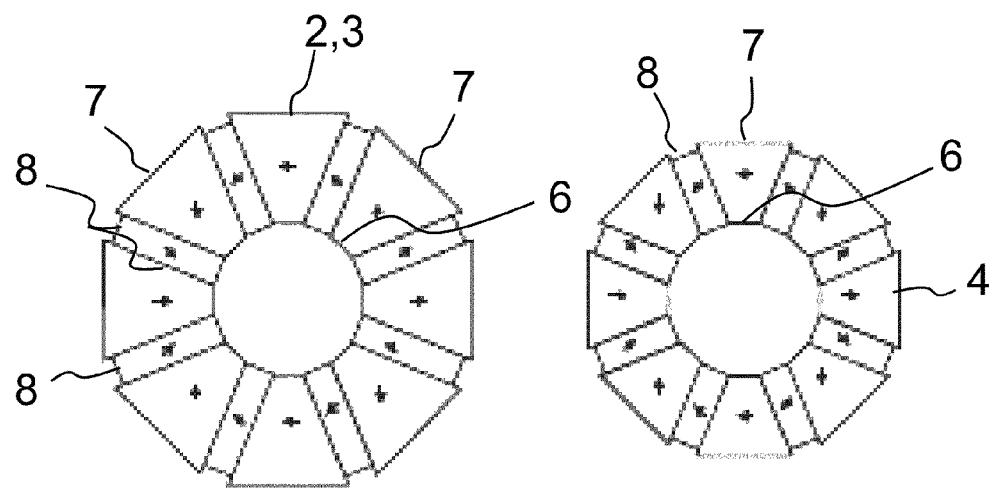
Fig. 2
Fig. 3
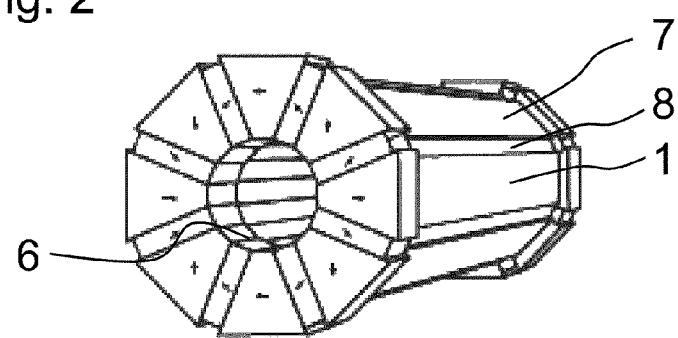
Fig. 4

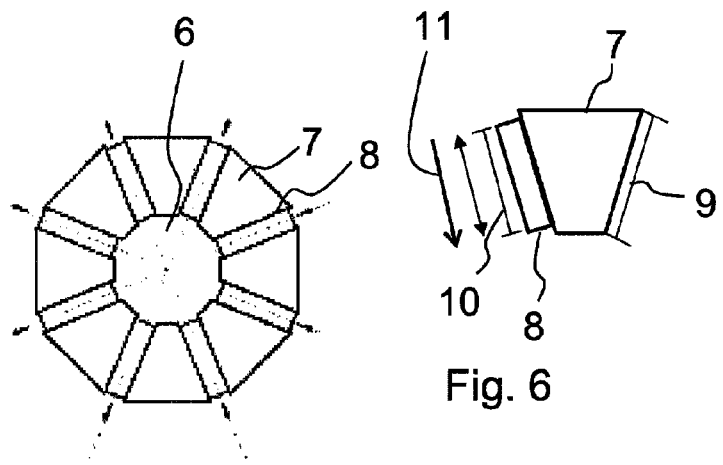
Fig. 5
Fig. 6
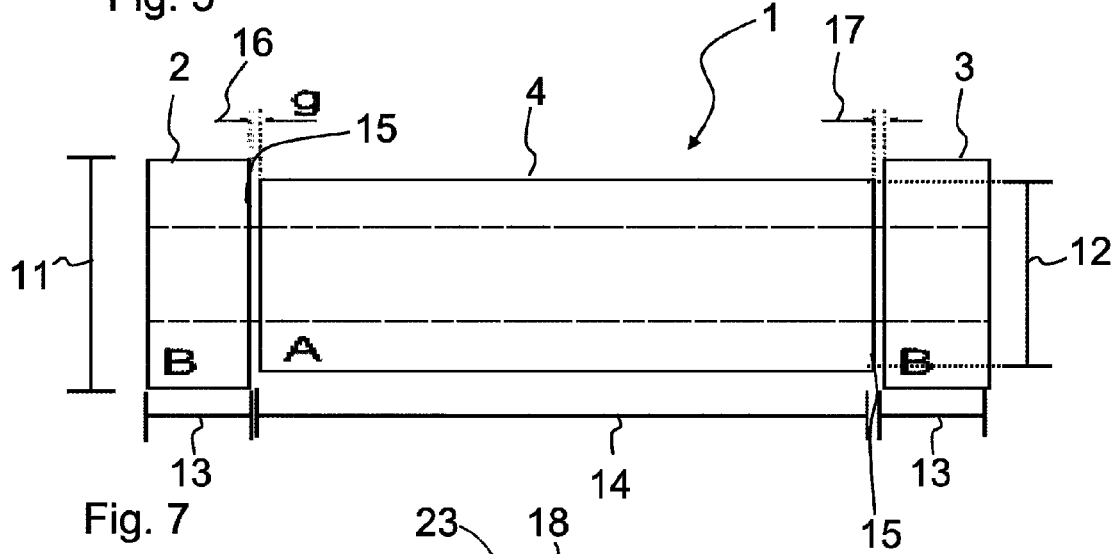
Fig. 7
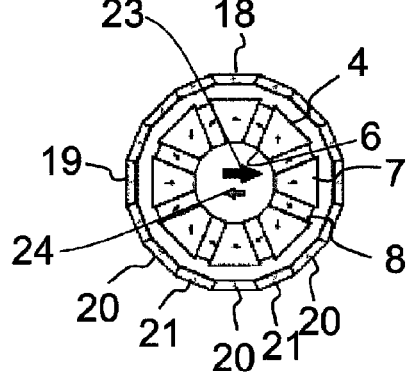
Fig. 8

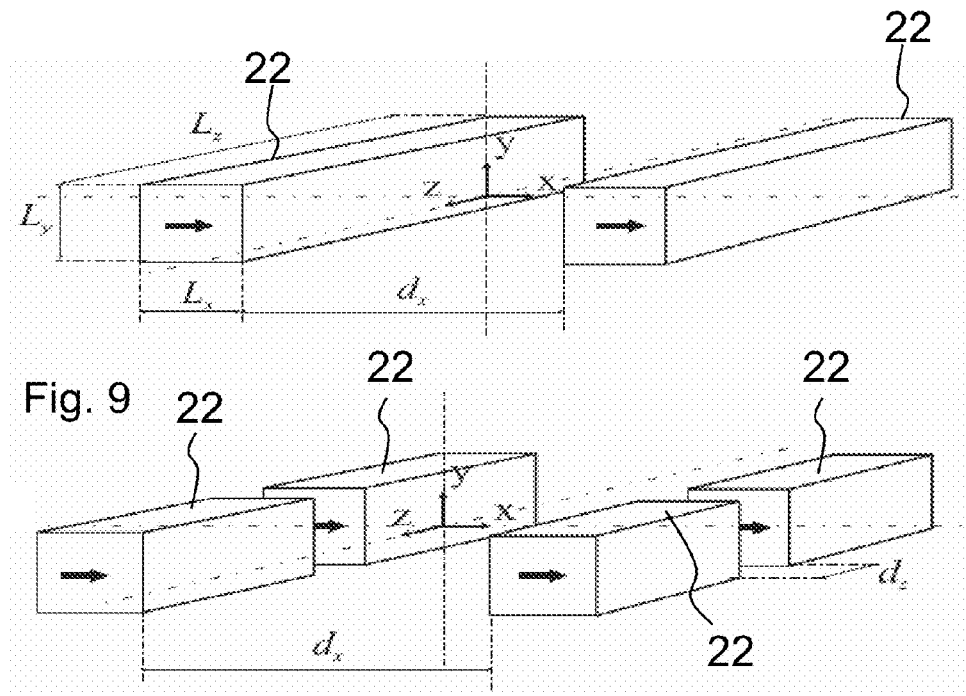
Fig. 9
Fig. 10
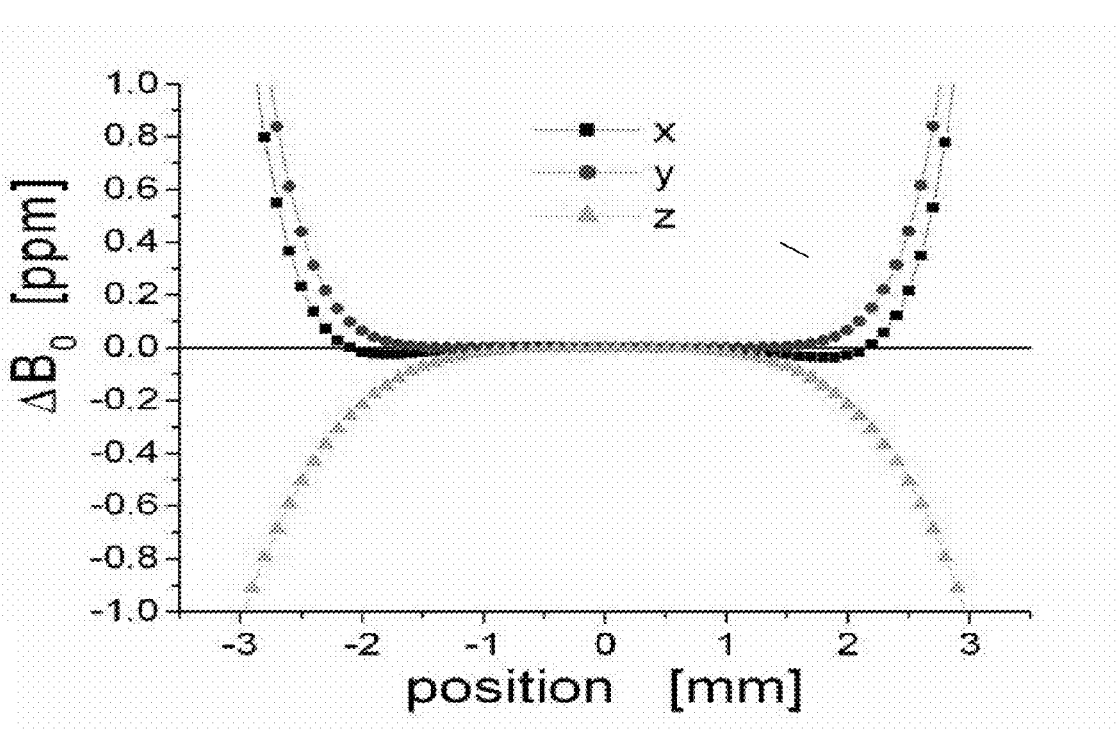
Fig. 11

MAGNET ARRANGEMENT AND METHOD FOR PROVIDING A MAGNETIC FIELD IN A SENSITIVE VOLUME

FOREIGN PRIORITY CLAIM

This patent application claims priority to European Patent Application No. 08159850.0 filed on Jul. 7, 2008, entitled, "MAGNET ARRANGEMENT AND METHOD FOR PROVIDING A MAGNETIC FIELD IN A SENSITIVE VOLUME", the contents and teachings of which are hereby incorporated by reference in their entirety.

FIELD OF THE INVENTION

Some embodiments are directed to a magnet arrangement made of several ring magnets which generates a magnetic field and a respective method to shim the magnetic field to high homogeneity. A main application of the magnet arrangement is the provision of sensitive volumes for high resolution nuclear magnetic resonance (NMR) spectroscopy.

BACKGROUND

Nuclear magnetic resonance (NMR) is usually carried out in the highly homogeneous fields generated by large and static superconducting magnets. In general, the samples under study have to be taken into the magnet, limiting the use of NMR for in situ measurements. To overcome these disadvantages portable magnets made from permanent magnetic materials have been proposed as e. g. in DE 199 39 626 C2.

Although in theory, this magnet geometry should provide a quite homogeneous field, in practice, the inhomogeneity of the magnetic material, and the inaccuracy in the size and positioning of the pieces in the final array, lead to important field distortions. These imperfections preclude the use of mobile sensors for high resolution spectroscopy purposes.

SUMMARY

Based on this, it is an object of certain embodiments of the present invention to relieve the disadvantages known from prior art at least in part and in particular to provide a magnet arrangement and a respective method for providing a magnetic field homogeneity in a sensitive volume allowing NMR spectroscopy, whereas the magnet arrangement is easily transportable.

These objects are accomplished by a magnet arrangement and a method for providing a magnetic field in a sensitive volume having the features as described herein.

The magnet arrangement according to certain embodiments of the present invention includes:
a) a first and a second head ring magnet each having a substantially circular geometry with respect to a centre axis and
b) a central ring magnet having a substantially circular geometry with respect to a centre axis;
said central ring magnet being disposed between the first and the second head ring magnet in direction of the centre axis.
In accordance with the present certain embodiments of at least one of the following magnets:
A) the first head ring magnet;
B) the second head ring magnet; and
C) the central ring magnet
includes a first number of first magnets and a second number of second magnets forming together the substantially annular geometry, wherein an orientation of the magnetic polarization of the magnets is different for adjacent magnets, wherein at least two first magnets represent a guidance for one second magnet disposed in between these two first magnets allowing a radial movement of said second magnet.

The term substantially annular geometry is understood in such a way that the ring magnets have an annular geometry having an inner open space situated around the centre axis of circular or nearly circular geometry. The substantially annular ring magnets are formed from first magnets having preferably a trapezoidal cross section in the respective cross section and second magnets having a rectangular cross section in this cross section. The preferred minimum first number of first magnets is four and is identical to the preferred minimum second number of second magnets which is four as well. It is understood that a trapezoidal cross section has the form of a trapezoid which is a quadrilateral being a shape of four sites that has one pair of parallel lines.

The magnet arrangement according to certain embodiments of the present invention is in particular designed such that the polarization of the first and second magnets are arranged in a Halbach-configuration leading to a strong magnetic field in the central open space within the ring magnets and a very small field outside the ring magnets. The magnet arrangement according to certain embodiments of the present invention allows the generation of highly homogeneous fields within the ring magnets allowing the insertion of conventional 5 mm NMR tubes. These samples can be studied with conventional NMR-techniques having a line width of less than 0.1 ppm. By movement of at least one of the second magnets relative to the first magnets the magnetic field within the ring magnets which is within the sensitive volume of a respective NMR-apparatus, can be changed. By moving at least one second magnet it is possible to shim the magnetic field, that is, the homogeneity of the magnetic field within the sensitive volume which is inside the circular magnets is increased. The magnet arrangement according to certain embodiments of the present invention can be palm size, allowing at the same time the measurement of samples of up to 5 mm diameter. The second magnets can be moved radially inwards and/or outwards.

The radial degree of freedom of the preferably eight second magnets which are preferably shaped as rectangular pieces in between the eight first magnets which are preferably shaped as trapezoidal pieces allows the size of the sensitive volume to be equal or even higher than the region obtained with a Halbach arrangement composed from 16 static trapezoids as is e. g. disclosed in K. Halbach, Nucl. Instr. and Meth. 169, 1-10 (1980).

According to certain embodiments of the present invention the first magnets have at least a trapezoidal cross section in a plane perpendicular to the centre axis.

The first magnets having a trapezoidal cross section allow the formation of guidances by a parallel alignment of two planar surfaces of the said trapezoidal magnets.

According to certain embodiments of the present invention the first and second head ring magnet and the central ring magnet have each a longitudinal extent in the direction of the centre axis and a radial extent perpendicular to the direction of the centre axis, wherein the longitudinal extend of the central ring magnet is larger than the longitudinal extend of the first and second head ring magnet, wherein the radial extent of the first and the second head ring magnet is larger than the radial extent of the central ring magnet.

It has been found that the system in which the longitudinal extent of the central ring magnet is longer than the longitudinal extent of the respective head ring magnets has a higher homogeneity within the open space inside the ring magnets, in particular inside the central ring magnet. The field homogeneity is further increased by a radial extent of the head ring magnets being larger than the radial extent of the central ring magnet. By this configuration a high homogeneity of the magnetic field can be reached.

According to the further improvement of the magnet arrangement according to certain embodiments of the present invention the first and second head ring magnet have a first outer radial extent which is in particular defined by the distance of the outer boarders of first magnets being disposed opposite to each other, the central ring magnet having a second outer radial extent being in particular defined by the distance of the outer boarders of first magnets being disposed opposite to each other, wherein the ratio of the first outer radial extent to the second outer radial extent is between 1.1 and 1.3.

It has been found that the homogeneity of the magnetic field within the ring magnets is in particular high if the respective ratio is set between 1.1 and 1.3. This is in particular the case for the magnetic field in the radially central region of the central magnet where the sensitive volume is usually situated.

A further improvement of the magnet arrangement according to certain embodiments of the present invention is directed to first and second head ring magnets having a first longitudinal extent, whereas the central ring magnet has a second longitudinal extent, wherein the ratio of the first longitudinal extent to the second longitudinal extent is between 0.1 and 0.3.

The mentioned ratio between the first and second extents leads to surprisingly good homogeneity of the magnetic field within the sensitive volume being situated centrally in the ring magnets, According to a further improvement of the magnet arrangement according to certain embodiments of the present invention a shim unit including at least one shim ring magnet as present which is disposed radial outside of at least one of the following magnets:
a) the first head ring magnet;
b) the second head ring magnet and
c) the central ring magnet,
whereas the at least one shim ring magnet (19) includes a third number of third magnets (20) and a fourth number of fourth magnets (21) forming together the substantially annular geometry, wherein an orientation of the magnetization of the magnets (20, 21) is different for adjacent magnets (21, 20), wherein at least two third magnets (20) represent a guidance for one fourth magnet (21) disposed in between these two third magnets (20) allowing a radial movement of said fourth magnet (21).

Preferably the third and fourth magnets of the at least one shim ring magnet as well as the first and second magnets are arranged in a Halbach-configuration. It is preferred that the third and fourth number is larger than the first and second number. The preferred minimum third and fourth number is four. The shim unit allows the build up of a temperature self-compensating magnet. Due to a change of the temperature of the ring magnets the magnetic field generated by these magnets usually shifts. In a preferred temperature of 10 to 30° C. this shift is usually linear dependent on a so called temperature coefficient. As all magnetic materials posses negative temperature shift it is possible to create a magnet arrangement which is self-compensating with regard to the temperature shift if the fields generated by the main and shim units oppose each other. This can be reached by shaping the first and the second magnets from a first magnetic material having a first temperature coefficient and the third and fourth magnets from a second magnetic material having a second temperature coefficient. All first and second magnets generate a first over all magnetic field in a sensitive volume within the ring magnets whereas all third and fourth magnets generate a second over all magnetic field in the sensitive volume. The orientation of the first and the second overall magnetic fields is opposite, the ratio of the first temperature coefficient to the second temperature coefficient is within 90% and 110%, preferably within 97% to 103%, in particular of 99% to 101% of the negative ratio of the second over all magnetic field to the first over all magnetic field.

This leads to a magnetic field in the sensitive volume which is temperature self compensating. Shifts of the temperature do only lead to a very slight shift of the magnetic field in the sensitive volume. This allows the generation of magnetic fields in the sensitive volume which are at most only slightly shifting with temperature.

For example it is possible to shape the first and second magnets from SmCo and the third and fourth magnets from NeFeB, the first overall magnetic field in the centre region of the central ring magnet being 30 MHz and the second overall magnetic field in the centre region of the central ring being 3 MHz.

According to a further improvement of the magnet arrangement according to certain embodiments of the present invention at least one of the following magnets:
i) the first magnets; and
ii) the third magnets
in at least one ring magnet are shaped and arranged such that two magnet having a trapezoidal cross section include a guidance for a magnet having a rectangular cross section arranged in between said two magnets having a trapezoidal cross section for movements in radial direction.

By this a defined movement of the rectangular first and/or third magnets in between the respective second and/or fourth magnets is possible. By this very precise adjustment of the magnetic field within the ring magnets can be reached.

Means for moving the respective first and/or third magnets can be easily employed by e.g. screws which move the respective trapezoidal magnets in a radial direction.

According to another improvement of certain embodiments of the present invention the magnet arrangement further includes first tuning means for moving at least one of the following magnets:
I) at least one second magnet; and
II) at least one fourth magnet
in a radial direction.

Such tuning means include e. g. screws which move the respective rectangular magnets into and out of the trapezoidal magnets in a radial direction.

According to a further improvement of certain embodiments of the present invention the magnet arrangement further includes second tuning means for moving at least one the following magnets:
i) the first head ring magnet; and
ii) the second head ring magnet
relative to the central ring magnet in a longitudinal direction.

It is preferred that the longitudinal direction is identical to the central axis of the respective ring magnets. These second tuning means include e. g. screws or nuts According to a further improvement of the magnet arrangement according to certain embodiments of the present invention in at least one ring magnet the respective magnets are arranged in a Halbach-configuration.

It is understood that the Halbach-configuration means an arrangement of permanent magnets that augment the magnetic field inside the device while cancelling the field to near 0 outside. This is reached by adjusting the single magnets such that the magnetisation of the single magnets changes from one magnet to the neighbouring magnet. The Halbach-configuration or Halbach-model is published in K. Halbach, Nucl. Instr. and meth. 169, 1-10 (1980) which is hereby incorporated by reference in its entirety and regarding the shape and adjustment of the single magnets and the magnetic polarization of the respective magnets.

It is preferred that in the central ring magnets and in both head ring magnets the first and second magnets are arranged in a Halbach configuration. It is preferred that in all shim ring magnets the third and fourth magnets are arranged in a Halbach configuration.

Furthermore, a method for shimming the magnetic field in a sensitive volume is disclosed wherein the magnetic field is generated within the sensitive volume by a) a first and a second head ring magnet each having a substantially circular geometry with respect to a centre axis; and b) a central ring magnet having a substantially circular geometry with respect to the centre axis wherein the sensitive volume is situated within at least one of the ring magnets which are provided such that the central ring magnet is disposed between the first and the second head ring magnet in a direction of the central axis, each ring magnet including a first number of first magnets and a second number of second magnets, said second magnets being disposed in between the first magnets in circumferential direction, wherein the magnetic field homogeneity within the sensitive volume is adjusted by moving at least one second magnet with respect to at least a pair of first magnets in a radial direction whereas two first magnets guide said second magnet disposed in between said two first magnets in radial direction.

It is preferred that not only one second magnet is moved at the time but that pairs of second magnets are moved which are disposed on opposite sites of the ring magnet. It is preferred that the sensitive volume is situated within the central ring magnet and preferably in a central region around the centre axis of the central ring magnet. Preferably the first magnets have a trapezoidal cross section in a plane perpendicular to the centre axis, preferably the second magnets have a rectangular cross section in said plane. The sensitive volume is a sensitive volume suitable for NMR measurements.

According to a further improvement of the method according to certain embodiments of the present invention at least one of the following magnets:

a) the first head ring magnet; and
b) the second head ring magnet is moved relative to the central magnet in a longitudinal direction.

According to a further improvement of the method according to certain embodiments of the present invention a second overall magnetic field is generated within the sensitive volume by providing a shim unit including at least one shim ring magnet disposed radially outside of at least one of the following magnets:

a) the first head ring magnet;
b) the second head ring magnet; and
c) the central ring magnet;

whereas at least one of the shim ring magnet includes a third number of third magnets having at least one trapezoidal cross section and a fourth number of fourth magnets being disposed in between the third magnets in circumferential direction.

According to a further improvement of the method according to certain embodiments of the present invention at least one of the following groups of magnets:

a) the first and the second magnets in the first head ring magnet;

b) the first and the second magnets in the second head ring magnet;

c) the first and the second magnets in the central ring magnet; and d) the third and the fourth magnets in at least one shim ring magnet of the shim unit are arranged in a Halbach-configuration.

Furthermore, an NMR-device is proposed including at least one magnet arrangement according to certain embodiments of the present invention.

Furthermore, the use of a magnet arrangement according to certain embodiments of the present invention for providing a homogeneous sensitive volume for NMR-measurements is proposed.

BRIEF DESCRIPTION OF THE DRAWINGS

All details and embodiments disclosed for the magnet arrangement according to the present invention can be applied to the method according to the present invention, the NMR-device according to the present invention and the use of a magnet arrangement according to the present invention and vice versa, respectively. Embodiments of the invention will now be described in detail, by way of example only, with reference to the accompanying drawings, in which the following is depicted schematically:

FIG. 1: a longitudinal section of a first embodiment of a magnet arrangement according to the present invention;

FIG. 2: a first and second head ring magnet of the first embodiment of a magnet arrangement according to the present invention, in a cross sectional view;

FIG. 3: a central ring magnet of a first embodiment of a magnet arrangement according to the present invention, in a cross sectional view;

FIG. 4: a perspective view of a first embodiment of a magnet arrangement according to the present invention;

FIG. 5: a cross sectional view of a first embodiment of a magnet arrangement according to the present invention;

FIG. 6: a detail of a cross sectional view of a first embodiment of a magnet arrangement according to the present invention;

FIG. 7: a longitudinal section of a first embodiment of a magnet arrangement according to the present invention;

FIG. 8: a second embodiment of a magnet arrangement according to the present invention in a cross sectional view;

FIGS. 9 and 10: examples of movements of magnets for shimming a magnetic field in a sensitive volume; and FIG. 11: magnetic fields along different directions in the sensitive volume of a magnet arrangement according to the present invention.

DETAILED DESCRIPTION

FIG. 1 shows schematically a longitudinal section of a magnet arrangement 1 according to certain embodiments of the present invention. The magnet arrangement 1 includes a first head ring magnet 2 and a second head ring magnet 3. Furthermore, the magnet arrangement 1 includes a central ring magnet 4. The central ring magnet 4 is disposed between the first head ring magnet 2 and the second head ring magnet 3 in direction of a centre axis 5 which is in this embodiment common to all ring magnets 2, 3, 4. All ring magnets 2, 3, 4 are shaped such that an inner open space 6 is freely accessible from the face sides and samples can be introduced into this open space 6. The ring magnets 2, 3, 4 are aligned such that the open space 6 of all these ring magnets 2, 3, 4 is aligned.

FIG. 2 shows schematically a cross sectional view of the first head ring magnet 2 and the second head ring magnet 3 which are basically shaped identical. Each head ring magnet 2, 3 is shaped of eight first magnets 7 and eight second magnets 8. The second magnets 8 are disposed between the first magnets 7 in a circumferential direction. This means that each second magnet 8 is disposed between two first magnets 7. The first magnets 7 are shaped trapezoidal in a cross sectional view and rectangular in direction of the centre axis 5. The trapezoidal cross section of the first magnets 7 is depicted in FIG. 2. The second magnets 8 display a rectangular cross section in a direction perpendicular to the centre axis 5. A cross section in direction of the centre axis 5 is rectangular for the second magnets 8 as well. The first magnets 7 and second magnets 8 are disposed such that a ring magnet having a substantially circular geometry with respect to the centre axis 5 is formed.

Each ring magnet 2, 3 has an open space 6 which is radial outwardly limited by the first magnets 7 and second magnets 8. The first magnets 7 of the ring magnets 2, 3, 4 are shaped such that the surfaces, which are in contact with the second magnets 8, are aligned in direction of the centre axis 5.

The magnets 7, 8 are made of permanent magnets, the orientation of their magnetization being depicted with an arrow for each of the magnets 7, 8 in FIGS. 2, 3. The magnetization of the first magnets 7 and the magnets 8 are disposed in a so called Halbach-configuration resulting in a magnetic field within the open space 6 which is augmented and in a nearly zero magnetic field outside the ring magnets 2, 3. In the open space 6 a sample or probe can be implemented as well as a coil (not displayed) for performing NMR (nuclear magnetic resonance) experiments within the open space 6. This coil is used for exciting and detecting electromagnetic signals from the spins of nuclei within the sample.

The second magnets 8 are movable in a radial direction. This results in a change of the magnetic field homogeneity within the open space 6. By moving the second magnets 8 with regard to the first magnets 7 it is possible to amend the magnetic field within the open space 6 from possible positioning errors or polarization inhomogeneity of the magnetic pieces 7, 8. Then, a more homogeneous magnetic field in the sensitive volume around the centre axis 5 is reached.

FIG. 3 displays schematically a cross sectional view of the central ring magnet 4. The central ring magnet 4 includes first magnets 7 having a trapezoidal cross section and second magnets 8 having two rectangular cross sections as well. The first magnets 7 and second magnets 8 of the central ring magnet 4 are in a radial direction smaller than the respective head ring magnets 2, 3 as can be seen from a comparison of FIGS. 2 and 3 as well as of FIG. 1. The first magnets 7 and second magnets 8 of the central ring magnet 4 are in a longitudinal direction longer than the respective head ring magnets 2, 3 as can be seen from a comparison of FIG. 1.

FIG. 4 displays schematically the magnet arrangement 1 in a perspective view. The first magnets 7 and the second magnets 8 of both the head ring magnets 2, 3 and the central magnet 4 have adjacent to the open space 6 the same dimensions as can be seen from FIG. 4.

FIG. 5 displays schematically the possibilities of moving at least one second magnet 8 with respect to the first magnets 7. The second magnets 8 are movable radially inward and outward relative to the first magnets 7. This is depicted in FIG. 6 schematically. FIG. 6 further depicts that the first radial extent 9 of the first magnets 7 is larger than the second radial extent 10 for allowing a better radial movement of the second magnets 8 without intruding in the open space 6. Nevertheless, in other examples it is possible and advantageous that the first radial extent 9 of the first magnets 7 is smaller than the second extent 10 of the second magnets 8. The latter is even more advantageous for higher homogeneities. The second magnets 8 are movable into the movement directions 11 as depicted in FIG. 6.

FIG. 7 displays schematically a further longitudinal section of a magnet arrangement 1 according to certain embodiments of the present invention. The first head ring magnet 2 and second head ring magnet 3 have a different outer radial extent than the central ring magnet 4. The first head ring magnet 2 and the second head ring magnet 3 have a first outer radial extent 11 whereas the central ring magnet 4 has a second outer radial extend 12. The outer radial extents 11, 12 are defined by the distance of the outer borders of first magnets 7 being disposed opposite to each other in the respective ring magnet 2, 3, 4. The ratio of the first outer radial extent 11 to the second outer radial extent 12 is 1.2 in the respective example.

As can be seen in FIG. 7 the first head ring magnet 2 and second head ring magnet 3 have a first longitudinal extent 13 whereas the central ring magnet 4 has a second longitudinal extent 14. The ratio of the first radial extend 13 to the second radial extend 14 is in this example 0.167.

The magnetic field homogeneity within the central ring magnet 4 can be changed by moving the first head ring magnet 2 and/or the second head ring magnet 3 relative to the central ring magnet 4. The respective gaps 15 between the first head ring magnet 2 and the central ring magnet 4 as well as the gap 16 between the second head ring magnet 2 and the central ring magnet 4 can be varied individually or together.

FIG. 8 displays a further embodiment of the present invention. This second embodiment is depicted in a cross sectional view in which the central ring magnet 4 can be seen. As discussed above it includes a plurality of first magnets 7 and second magnets 8 which are arranged in a Halbach-configuration. The polarization direction of the respective magnets are shown as arrows within the magnets. Within the open space 6, the first overall magnetic field 23 is generated by the first magnets 7 and the second magnets 8 while the second overall magnetic field 24 is generated by the third magnets 20 and the fourth magnets 21. The central ring magnet 4 is surrounded by a shim unit 18. This shim unit 18 includes at least one shim ring magnet 19. The shim ring magnet is disposed radial outside the central ring magnet 4. It is furthermore disposes radial outside the first head ring magnet 2 and the second head ring magnet 3. The shim ring magnet 19 includes a third number (eight in this embodiment) of third magnets 20 having a trapezoidal cross section and a fourth number (eight in this embodiment) of fourth magnets 21 having a rectangular cross section disposed in between the third magnets 20 in circumferential direction. The shim ring magnet 19 is formed such that the polarization of the third magnets 20 and the fourth magnets 21 are disposed in a Halbach-configuration as well. The longitudinal length of the shim unit 18 or the sum of the longitudinal length of the respective shim ring magnets 19 is preferably equal or shorter than the longitudinal extent of the first head ring magnet 2, the second head ring magnet 3 and the central ring magnet 4. This means that it is preferably equal or smaller than the sum of the second longitudinal extend 14 and two times the first longitudinal extend 13.

It is preferred that the whole magnet arrangement is temperature self-compensated. For this reason it is preferred that the first and second magnets 7, 8 on the one hand and the third and fourth magnets 20, 21 on the other hand are made of different magnetic materials with different temperature coefficients. If the shim unit 18 generates a shim magnetic field $B_S$ in the central region of the magnet arrangement 1, which is the sensitive volume, whereas the first head ring magnet 2, the second head ring magnet 3 and the central ring magnet 4 generate a magnetic field $B_M$ at the sensitive volume, the total magnetic field in the sensitive volume is the vectorial sum of these two fields:

$$B = B_S + B_M.$$

Considering that the fields depend linearly on temperature $$B_i = B_{i0}(1 - \kappa_i \Delta T)(i = S, M),$$

where $\kappa_i$ is the temperature coefficient of each material, $\Delta T = T - T_0$ and $B_{i0} = B_i(T_0)$. This can be written as $$B = B_{S0} + B_{B0} - (B_{S0}\kappa_S + B_{M0}\kappa_M)\Delta T$$

The resulting magnetic field can be made temperature independent if the following relation is fulfilled:

$$(B_{S0}\kappa_S + B_{M0}\kappa_M) = 0$$

In the second embodiment according to the present invention the shim unit 18 is designed such that the above given equation is satisfied. This means that not only the direction of $B_{S0}$ is the opposite as the one of $B_{M0}$ but also that their ratios satisfy $B_{S0}/B_{M0} = \kappa_M/\kappa_S$. Moreover, by moving at least one of the rectangular fourth magnets 21, preferably a pair of fourth magnets 21 disposed on opposite sides of the shim ring magnet 19 in radial direction, linear and quadratic spatial corrections of the magnetic field B can be generated.

The first head ring magnet 2, the second head magnet 3 and the central ring magnet 4 as well as the shim unit 18 are designed such that the fields generated by these magnets 2, 3, 4, 18 oppose each other in order to compensate the polarization variation of permanent magnets which is strongly dependent on temperature as can be seen from the equation above.

Linear and quadratic spatial corrections of the resulting magnetic field can—as stated above—be obtained by a movement of at least one respective fourth magnet 21 or second magnet 8.

With respect to FIGS. 9 and 10 the terms of the magnetic field which can be generated by moving the rectangular seconds magnets 8 and/or the rectangular fourth magnets 21 are explained. FIG. 9 discloses a pair of two identical rectangular bar magnets 22. The bar magnets 22 are polarised along the displayed x-axis and are separated by a gap $d_x$. This pair of bar magnets 22 can represent any pair of rectangular bar magnets 8, 21 depicted on the embodiments of the present invention as shown and discussed above. The magnetic field generated in a volume centred within this array is mainly oriented along the x-axis and due to symmetry it possesses only even terms in its Taylor expansion.

Along x the field is minimum in the centre of the two magnets (x=0) and increases as the permanent magnets blocks are approached. This is mainly due to the inverse dependence of the field on the distance of the magnetic source. Close to the centre, a quadratic term dominates and the magnetic field is shaped like an arms-up-parabola centred at x=0. Moreover, also due to symmetry the field dependence must be an even function of z. But in this case the magnetic field decreases when moving away from the centre behaving like an arms-down-parabola, reflecting the finite size of the magnet along z. The same argument leads to a similar behaviour along y.

The magnitude of the quadratic coefficient that characterise the parabolas indicates the degree of homogeneity of the field. Due to Maxwell's equations which make the dependence of the field along x, y and z not independent, the presence of one control variable which is e. g. $d_x$ is enough to control the homogeneity along two directions x and y, when the quadratic coefficient along the third direction z is 0. The dependence of the magnetic field on $d_x$ is as follows. For high values of $d_x$ the field becomes flatter around x=0 and the opposite behaviour is observed when the bar magnets 22 are brought close one from each other. If $L_Z \gg L_X, L_Y$ it is possible to include an extra control variable by opening a gap $d_z$ along z direction. Since any imperfection of the bar magnets 22 will introduce an asymmetry in the magnetic field that can be characterised up to order 1 by linear components x, y and z it is important to consider the generation of linear order terms.

The first order terms, or a constant gradient can be obtained by moving the two bar magnets 22 in the same direction. For instance if a linear gradient along x is desired moving the two magnets to the right generates negatively near dependence of the field around x=0. The field observed at this point has not the shape of a centred parabola but instead a displaced parabola which has the linear contribution at the origin. Although the analysis presented so far corresponds to the particular case of rectangular magnetic pieces, it is valid for other geometries and polarisation directions. The important aspect is the piece distribution symmetry around the origin. This means that the sensitive volume is usually situated within the ring magnets 2, 3 near or in the surrounding of the respective centre axis 5.

FIG. 11 displays schematically the magnetic field generated along the three axis of the respective magnet arrangements as depicted in the above given figures. The magnetic field dependency is depicted in the central region of the open space 6 near and around the centre axis 5. A palm size magnet arrangement 1 whose length is 8 cm and 4 cm in diameter generates a field of about 0.7 Tessla with a homogeneity better than 0.1 ppm in a sphere of about 4 mm diameter. Such a volume enables the use of conventional 5 mm NMR-tubes.

The magnet arrangement 1 according to certain embodiments of the present invention as well as the respective method according to certain embodiments of the present invention allow the provision of quite homogeneous shimmable and tuneable magnetic fields for use in NMR-measurements. Certain embodiments of present invention allow the measurement of a mass spectra with high homogeneous with simple and cheap magnet arrangement 1.

LIST OF REFERENCE NUMBERS 1 magnet arrangement
2 first head ring magnet
3 second head ring magnet
4 central ring magnet
5 centre axis
6 open space
7 first magnet
8 second magnet
9 first radial extent
10 second radial extent
11 first outer radial extent
12 second outer radial extent
13 first longitudinal extent
14 second longitudinal extent
15 gap
16 first width
17 second width
18 shim unit
19 shim ring magnet
20 third magnet
21 fourth magnet
22 bar magnet 23 first overall magnetic field
24 second overall magnetic field

What is claimed is:

1. A magnet arrangement, comprising:
   a) a first and a second head ring magnet each having a substantially annular geometry with respect to a centre axis and
   b) a central ring magnet having a substantially annular geometry with respect to a centre axis;
   said central ring magnet being disposed between the first and second head ring magnet in direction of the centre axis;
   at least one of the following magnets:
   A) the first head ring magnet;
   B) the second head ring magnet; and
   C) the central ring magnet including a first number of first magnets and a second number of second magnets, each of said second magnets being disposed in between two of said first magnets in a circumferential direction, forming together the substantially annular geometry, wherein an orientation of the magnetic polarization of the magnets is different for adjacent magnets, wherein at least two first magnets represent a guidance for one second magnet disposed in between these two first magnets allowing a radial movement of said second magnet, said second magnet being in physical contact with the adjacent two first magnets during radial movement of the second magnet.

2. Magnet arrangement according to claim 1, wherein the first magnets have at least a trapezoidal cross section in a plane perpendicular to the centre axis.

3. Magnet arrangement according to claim 1, wherein the first and second head ring magnet and the central ring magnet each have a longitudinal extent in the direction of the centre axis and a radial extent perpendicular to the direction of the centre axis, wherein the longitudinal extent of the central ring magnet is larger than the longitudinal extent of the first and second head ring magnet, wherein the radial extent of the first and second head ring magnet is larger than the radial extent of the central ring magnet.

4. Magnet arrangement according to claim 1, further comprising a shim unit comprising at least one shim ring magnet having a substantially annular geometry disposed radially outside of at least one of the following magnets:
   a) the first head ring magnet;
   b) the second head ring magnet; and
   c) the central ring magnet,
   whereas the at least one shim ring magnet comprises a third number of third magnets and a fourth number of fourth magnets, each of said fourth magnets being disposed in between two of said third magnets in a circumferential direction, forming together the substantially annular geometry, wherein an orientation of the magnetization of the magnets is different for adjacent magnets, wherein at least two third magnets represent a guidance for one fourth magnet disposed in between these two third magnets allowing a radial movement of said fourth magnet, said fourth magnet being in physical contact with the adjacent two third magnets during radial movement of the fourth magnet.

5. Magnet arrangement according to claim 4, wherein the third magnets have at least a trapezoidal cross section in a plane perpendicular to the centre axis.

6. Magnet arrangement according to claim 4, wherein the first and second magnets are shaped from a first magnetic material having a first temperature coefficient, wherein the third and fourth magnets are shaped from a second magnetic material having a second temperature coefficient, whereas all first and second magnets generate a first overall magnetic field in a sensitive volume within the ring magnets, whereas all third and fourth magnets generate a second overall magnetic field in the sensitive volume, whereas the orientation of the first and second overall magnetic fields is opposite, whereas the ratio of the first temperature coefficient to the second temperature coefficient is within 90% and 110% of the negative ratio of the second overall magnetic field to the first overall magnetic field.

7. Magnet arrangement according to claim 1, further comprising first tuning means for moving at least one of the following magnets:
   I) at least one second magnet and
   II) at least one fourth magnet in a radial direction.

8. Magnet arrangement according to claim 1, further comprising second tuning means for moving at least one of the following magnets:
   i) the first head ring magnet and
   ii) the second head ring magnet relative to the central ring magnet in a longitudinal direction.

9. Magnet arrangement according to claim 1, wherein in at least one ring magnet the respective magnets are arranged in a Halbach configuration.

10. NMR device, comprising at least one magnet arrangement according to claim 1.

11. Use of a magnet arrangement according to claim 1 for providing a homogeneous sensitive volume for NMR measurements.

12. Method for shimming the magnetic field in a sensitive volume, wherein a magnetic field is generated within the sensitive volume by
   a) a first and a second head ring magnet each having a substantially circular geometry with respect to a centre axis and
   b) a central ring magnet having a substantially circular geometry with respect to the centre axis
   wherein the sensitive volume is situated within at least one of the ring magnets which are provided such that the central ring magnet is disposed between the first and second head ring magnet in a direction of the centre axis, each ring magnet comprising a first number of first magnets and a second number of second magnets, each of said second magnets being disposed in between two of said first magnets in a circumferential direction, wherein the magnetic field homogeneity within the sensitive volume is adjusted by moving at least one second magnet with respect to at least one pair of first magnets in a radial direction, whereas two first magnets guide said second magnet disposed in between said two first magnets in radial direction radially inwards and outwards, said first magnets and second magnets being in physical contact during radial movement.

13. Method according to claim 12, wherein at least one of the following magnets:
   a) the first head ring magnet and
   b) the second head ring magnet is moved relative to the central ring magnet in a longitudinal direction.

14. Method according to claim 12, wherein a second overall magnetic field is generated within the sensitive volume by providing a shim unit comprising at least one shim ring magnet disposed radially outside of at least one of the following magnets:
   a) the first head ring magnet;
   b) the second head ring magnet; and
   c) the central ring magnet,
   whereas the at least one of the shim ring magnet comprises a third number of third magnets having at least one trapezoidal cross section and a fourth number of fourth magnets being disposed in between the third magnets in circumferential direction, said fourth magnet being in physical contact with the adjacent two third magnets during radial movement of the fourth magnet.

15. Method according to claim 12, wherein at least one of the following groups of magnets:
   a) the first and the second magnets in the first head ring magnet;
   b) the first and the second magnets in the second head ring magnet;
   c) the first and the second magnets in the central ring magnet; and
   d) the third and the fourth magnets in at least one shim ring magnet of the shim unit
are arranged in a Halbach configuration.

16. A magnet arrangement, comprising:
   a) a first and a second head ring magnet each having a substantially annular geometry with respect to a centre axis and
   b) a central ring magnet having a substantially annular geometry with respect to a centre axis;
   said central ring magnet being disposed between the first and second head ring magnet in direction of the centre axis;
   at least one of the following magnets:
   A) the first head ring magnet;
   B) the second head ring magnet; and
   C) the central ring magnet including a first number of first magnets and a second number of second magnets forming together the substantially annular geometry, wherein an orientation of the magnetic polarization of the magnets is different for adjacent magnets, wherein at least two first magnets represent a guidance for one second magnet disposed in between these two first magnets allowing a radial movement of said second magnet, and wherein the magnet arrangement further comprises:
      a shim unit comprising at least one shim ring magnet having a substantially annular geometry disposed radially outside of at least one of the following magnets:
      a) the first head ring magnet;
      b) the second head ring magnet; and
      c) the central ring magnet,
   whereas the at least one shim ring magnet comprises a third number of third magnets and a fourth number of fourth magnets forming together the substantially annular geometry, wherein an orientation of the magnetization of the magnets is different for adjacent magnets, wherein at least two third magnets represent a guidance for one fourth magnet disposed in between these two third magnets allowing a radial movement of said fourth magnet.

17. Magnet arrangement according to claim 16, wherein the third magnets have at least a trapezoidal cross section in a plane perpendicular to the centre axis.

18. Magnet arrangement according to claim 16, wherein the first and second magnets are shaped from a first magnetic material having a first temperature coefficient, wherein the third and fourth magnets are shaped from a second magnetic material having a second temperature coefficient, whereas all first and second magnets generate a first overall magnetic field in a sensitive volume within the ring magnets, whereas all third and fourth magnets generate a second overall magnetic field in the sensitive volume, whereas the orientation of the first and second overall magnetic fields is opposite, whereas the ratio of the first temperature coefficient to the second temperature coefficient is within 90% and 110% of the negative ratio of the second overall magnetic field to the first overall magnetic field.

19. Method for shimming the magnetic field in a sensitive volume, wherein a magnetic field is generated within the sensitive volume by
   a) a first and a second head ring magnet each having a substantially circular geometry with respect to a centre axis and
   b) a central ring magnet having a substantially circular geometry with respect to the centre axis,
   wherein the sensitive volume is situated within at least one of the ring magnets which are provided such that the central ring magnet is disposed between the first and second head ring magnet in a direction of the centre axis, each ring magnet comprising a first number of first magnets and a second number of second magnets, said second magnets being disposed in between the first magnets in circumferential direction,
   wherein the magnetic field homogeneity within the sensitive volume is adjusted by moving at least one second magnet with respect to at least one pair of first magnets in a radial direction, whereas two first magnets guide said second magnet disposed in between said two first magnets in radial direction, and
   wherein a second overall magnetic field is generated within the sensitive volume by providing a shim unit comprising at least one shim ring magnet disposed radially outside of at least one of the following magnets:
      a) the first head ring magnet;
      b) the second head ring magnet; and
      c) the central ring magnet,
      whereas the at least one of the shim ring magnet comprises a third number of third magnets having at least one trapezoidal cross section and a fourth number of fourth magnets being disposed in between the third magnets in circumferential direction.

20. Method for shimming the magnetic field in a sensitive volume, wherein a magnetic field is generated within the sensitive volume by
   a) a first and a second head ring magnet each having a substantially circular geometry with respect to a centre axis and
   b) a central ring magnet having a substantially circular geometry with respect to the centre axis,
   wherein the sensitive volume is situated within at least one of the ring magnets which are provided such that the central ring magnet is disposed between the first and second head ring magnet in a direction of the centre axis, each ring magnet comprising a first number of first magnets and a second number of second magnets, said second magnets being disposed in between the first magnets in circumferential direction,
   wherein the magnetic field homogeneity within the sensitive volume is adjusted by moving at least one second magnet with respect to at least one pair of first magnets in a radial direction, whereas two first magnets guide said second magnet disposed in between said two first magnets in radial direction, and
   wherein at least one of the following groups of magnets:
      a) the first and the second magnets in the first head ring magnet;
      b) the first and the second magnets in the second head ring magnet;
      c) the first and the second magnets in the central ring magnet; and
      d) the third and the fourth magnets in at least one shim ring magnet of the shim unit are arranged in a Halbach configuration.

* * * * *